United States Patent
Chmielewski et al.

(10) Patent No.: US 7,180,291 B2
(45) Date of Patent: Feb. 20, 2007

(54) DEGENERATE BIRDCAGE COIL AND TRANSMIT/RECEIVE APPARATUS AND METHOD FOR SAME

(75) Inventors: Thomas Chmielewski, Willoughby Hills, OH (US); James A. Flock, Euclid, OH (US); Timothy Eagan, Cleveland, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/536,334

(22) PCT Filed: Nov. 25, 2003

(86) PCT No.: PCT/IB03/05400

§ 371 (c)(1),
(2), (4) Date: May 25, 2005

(87) PCT Pub. No.: WO2004/048987

PCT Pub. Date: Jun. 10, 2004

(65) Prior Publication Data

US 2006/0033497 A1 Feb. 16, 2006

Related U.S. Application Data

(60) Provisional application No. 60/457,039, filed on Mar. 24, 2003, provisional application No. 60/429,509, filed on Nov. 27, 2002.

(51) Int. Cl.
*G01V 3/00* (2006.01)
(52) U.S. Cl. ...................... 324/318; 324/322
(58) Field of Classification Search ............... 324/318, 324/322
See application file for complete search history.

(56) References Cited

U.S. PATENT DOCUMENTS 4,680,548 A 7/1987 Edelstein et al.

(Continued)

FOREIGN PATENT DOCUMENTS

DE 43 31 021 A1 3/1995

(Continued)

OTHER PUBLICATIONS

T. Eagan, et al., "Understanding Approximately Degenerate Eigenmodes in Two-Ring and Three-Ring RF Birdcages," *Proceedings of the ISMRM tenth scientific meeting and exhibition*, May 18-24, 2002, pp. 1-2.

(Continued)

*Primary Examiner*—Diego Gutierrez
*Assistant Examiner*—Megann E Vaughn
(74) *Attorney, Agent, or Firm*—Fay Sharpe Fagan Minnich & McKee LLP

(57) ABSTRACT

A birdcage coil (16) used in conjunction with a magnetic resonance imaging apparatus includes a first conductive loop (81, 581), a second conductive loop (82, 582), and a plurality of first conductor rungs (80, 580) disposed between the first and second conductive loops. A third conductor (83, 83", 583) is coupled to the second conductive loop at resonance frequencies, such as by second conductor rungs (84, 84", 584). The birdcage coil also includes switches (590) for switching the birdcage coil at least among: 1) an RF transmit mode to operate as an RF transmit coil; and 2) an RF receive mode to operate as an RF receive coil.

26 Claims, 14 Drawing Sheets

U.S. PATENT DOCUMENTS

| | | | |
|---|---|---|---|
| 4,952,878 | A | 8/1990 | Mens |
| 5,144,241 | A | 9/1992 | Oppelt |
| 5,179,332 | A | 1/1993 | Káng |
| 5,559,434 | A * | 9/1996 | Takahashi et al. .......... 324/318 |
| 5,646,531 | A | 7/1997 | Renz |
| 6,040,697 | A * | 3/2000 | Misic .......................... 324/318 |
| 6,043,658 | A * | 3/2000 | Leussler ..................... 324/318 |
| 6,316,941 | B1 * | 11/2001 | Fujita et al. ................. 324/318 |
| 6,377,044 | B1 | 4/2002 | Burl et al. |
| 6,396,271 | B1 | 5/2002 | Burl et al. |
| 6,522,143 | B1 * | 2/2003 | Fujita et al. ................. 324/318 |
| 6,791,328 | B1 * | 9/2004 | Nabetani et al. ............ 324/318 |
| 2003/0201775 | A1 * | 10/2003 | Boskamp .................... 324/318 |

FOREIGN PATENT DOCUMENTS

| | | |
|---|---|---|
| EP | 0 366 188 | 5/1990 |
| EP | 0 390 476 | 10/1990 |
| EP | 0 498 539 A1 | 8/1992 |
| EP | 0 459 569 B1 | 3/1997 |
| WO | WO 02/08778 A1 | 1/2002 |
| WO | WO 02/095435 | 11/2002 |

OTHER PUBLICATIONS

J. Jevtic, "Ladder Networks for Capacitive Decoupling in Phased-Array Coils," *Proc. Intl. Soc. Mag. Reson. Med* 9 (2001), p. 17.

Fujita, et al., "Novel Quadrature Birdcage Coil for a Vertical $B_o$ Field Open MRI System," *Magnetic Resonance in Medicine*, 44:633-640 (2000).

J. Jin, Section 4.3.2 entitled "Highpass Birdcage Coil," *Electromagnetic Analysis and Design in Magnetic Resonance Imaging*, CRC Press, 1999, pp. 146-149.

Tropp, "The Hybrid Bird Cage Resonator," *Proceedings of the 11th Annual Meeting of the Society of Resonance in Medicine*, (1992).

Eagan, T., et al.; Group Therapy for a Three-Ring Birdcage Designed for SENSE Applications; 2003; Proc. Intl. Soc. Mag. Reson. Med.; 11:2383.

Ibrahim, T.S., et al.; Effect of RF Coil excitation on field inhomogeneity at ultra high fields: A field optimized TEM resonator; 2001; MRM; 19:1339-1347.

Kocharian, A., et al.; Wrist: Improved MR Imaging with Optimized Transmit-Receive Coil Design; 2002; Radiology; 223:870-876.

Tropp, J.; The Theory of the Bird-Cage Resonator; 1989; J. of Magnetic Resonance; 82:51-62.

Leussler, C., et al.; The Bandpass Birdcage Resonator Modified as a Coil Array for Simultaneous MR Acquisition; 1997; Proc. of ISMRM; 176.

Durr, W., et al.; A Dual-Frequency Circularly Polarizing Whole-Body MR Antenna for 69/170 MHz; 1991; MRM; 19:446-455.

\* cited by examiner

US 7,180,291 B2

DEGENERATE BIRDCAGE COIL AND TRANSMIT/RECEIVE APPARATUS AND METHOD FOR SAME

CROSS REFERENCE TO RELATED APPLICATIONS

This application claims the benefit of U.S. provisional application Ser. No. 60/429,509 filed Nov. 27, 2002, and U.S. provisional application Ser. No. 60/457,039 filed Mar. 24, 2003 which are incorporated herein by reference.

The present invention relates to the art of magnetic resonance imaging (MRI). It finds particular application in conjunction with bore type MRI scanners and will be described with particular reference thereto. However, it is to be appreciated that the present invention is also amenable to other like applications and other types of MRI scanners.

Commonly, in MRI, a substantially uniform, temporally constant main magnetic field, $B_0$, is set up in an examination region in which a subject being imaged is placed. Via magnetic resonance radio frequency (RF) excitation and manipulations, selected magnetic dipoles in the subject which are otherwise aligned with the main magnetic field are tipped (via RF pulses) into a plane transverse to the main magnetic field such that they precess or resonate. In turn, the resonating dipoles are allowed to decay or realign with the main magnetic field thereby inducing magnetic resonance (MR) echoes or an MR signal. The various echoes making up the MR signal are encoded via magnetic gradients set up in the main magnetic field. The raw data from the MRI scanner or apparatus is collected into a matrix commonly known as k-space. Typically, each echo is sampled a plurality of times to generate a data line or row of data points in k-space. The echo or data lines position in k-space is determined by its gradient encoding. Ultimately, employing inverse Fourier or other known transformations, an image representation of the subject is reconstructed from the k-space data.

Conventionally, when imaging a relatively large region such as the torso, a whole body radio frequency coil is used in both RF transmit and receive modes. By distinction, when imaging the head, neck, shoulders, or other relatively small region, local coils are often used as RF receive coils in conjunction with whole-body transmit coils. A reason for using local coils is that placing the local coil close to the imaged region improves the signal-to-noise ratio and the resolution.

Using a local coil for RF transmission can also be beneficial in some procedures. One such benefit is that using local coils during RF transmission can reduce the effects of specific absorption rate (SAR) and associated heating in the body as compared to RF transmissions from body coils.

One type of local coil for use in MRI scanners is known as the "birdcage" coil. So-called birdcage RF coils for receiving MR signals are generally known. See, for example, U.S. Pat. No. 4,680,548. Typically, a birdcage coil is cylindrical in shape and includes two conductive end loops or rings interconnected by an even number of rungs or axial conductors that divide the two end rings into arcs or segments defined therebetween. The construction gives this type of RF coil the appearance of a birdcage. Accordingly, the term "birdcage" is often used to refer to this type of geometry.

A birdcage coil of this kind commonly has many different resonance frequencies. Each resonance frequency is associated with a different resonant mode. Often, the birdcage coil is operated in a selected resonant mode to obtain inside the coil: (i) an as-uniform-as-possible field distribution (in the case of operation as a transmitter coil); and/or, (ii) a location-independent constant sensitivity (in the case of operation as a receiving coil). This location-independency of the sensitivity, notably in a plane perpendicular to the coil axis, can be advantageous because it facilitates the reconstruction of an image from the MR signals received thereby.

The electrical behavior of birdcage coils is described with reference to FIG. 2 which shows various resonance frequencies (ordinate) and resonance modes (abscissa). In principle, a birdcage coil can be considered as having a number of resonance modes or resonance frequencies which amount to half the number of legs or axial conductors joining the end rings together. An eight leg birdcage, therefore, has four different resonance frequencies and four different resonance modes (with a different field distribution or with a different location-dependent sensitivity). The resonance frequencies and resonance modes associated with a given proportioning of the coil are interconnected by dashed curves. Assuming an eight leg birdcage construction, different birdcage coil types can be distinguished as follows:

a) The low-pass type which is characterized in that the end rings do not have capacitances, so that only the locally distributed inductances of the individual arcs or segments of the loops are active. There are four different resonance frequencies, the lowest resonance frequency being associated with a resonance mode for which a uniform field distribution or sensitivity occurs in the area enclosed by the coil and which is, therefore, recommended. The other resonance modes, at the higher resonance frequencies, have field distributions which are less suitable and hence are not typically used. A curve for this type is denoted by the reference LP in FIG. 2.

b) The high-pass type is formed when capacitors are present only in the end loops, whereas the legs do not include a capacitor and consist of continuous conductors so that only the locally distributed inductances of the individual legs are active. This type also has four resonance frequencies with four resonance modes, the preferred resonance mode, however, lying at the highest frequency. The curve resulting for this type is denoted by the reference HP in FIG. 2.

c) The band-pass type includes capacitors in the two end rings as well as in the axial legs. As noted in U.S. Pat. No. 4,680,548, for example, a "high-pass" or "low-pass" behavior can be assigned to this band-pass type, depending on whether the capacitances in the legs or in the end rings behave inductively (the behavior of the respective other part being capacitive).

The curve for the aforementioned band-pass type with low-pass behavior is denoted by the reference $BP_l$ in FIG. 2, the preferred resonance mode (with locally uniform sensitivity) lying at the lowest resonance frequency. The band-pass type with high-pass behavior is represented by the curve $BP_h$ in FIG. 2, the preferred resonance mode lying at the highest resonance frequency.

There are also coil arrays (also known as phased-array coils which usually consist of a plurality of overlapping flat sub-coils) that have a signal-to-noise ratio which can be better than that of such a birdcage coil. Accordingly, it has been sought to achieve the advantages associated with coil arrays in the context of a birdcage geometry.

For example, U.S. Pat. No. 6,043,658 (the '658 patent) is directed to a band-pass type birdcage coil, including capacitances in the axial legs as well as in the two end loops. However, the capacitances are proportioned so that neither a high-pass behavior nor a low-pass behavior occurs, but rather the behavior represented by the line $BP_d$ in FIG. 2 is sought where all resonance modes occur or converge at substantially the same frequency. In Tropp, "The Hybrid Bird Cage Resonator," *Proceedings of the 11th Annual Meeting of the Society of Magnetic Resonance in Medicine*, (1992), this behavior is referred to as "degenerate." Accordingly, band-pass type birdcage coils having resonance frequencies that converge toward a common frequency, nominally referred to as the degenerate frequency of the coil, are referred to as degenerate birdcage coils.

The '658 patent recognizes that the otherwise multiple resonance frequencies of a band-pass type birdcage coil with given proportions or dimensions can be degenerated toward a single resonance frequency by appropriately selecting capacitances in the two end loops and the interconnecting axial legs so that they are suitably proportioned. At this degenerated resonance frequency, the individual neighboring meshes constituting the coil are decoupled from one another. Because of the decoupling, the meshes effectively function or may be operated as a coil array, and the MR signals received from the individual meshes can be independently processed in like manner. Note, a single mesh refers to two neighboring axial legs or conductors and the arcs or sections of the two end rings or loops which are situated therebetween.

Advantageously, in accordance with the teachings of the '658 patent, a common image can be reconstructed from the individual MR signal received by the respective individual meshes, wherein the common image has a relatively high signal-to-noise ratio, notably at the areas within the coil which are proximate to the meshes. That is to say, the individual meshes have a sensitivity which is location-dependent, i.e., a relatively higher sensitivity for signals from areas neighboring the meshes and a comparatively low sensitivity for signals from more remote areas. For example, when an overall image is formed from the individual MR signals received by the individual meshes, a signal-to-noise ratio can be obtained which, in comparison with an otherwise conventionally operated birdcage coil, is a factor from 2 to 4 higher in the outer areas whereas at its center it has substantially the same value as offered by conventional coil operation.

Notwithstanding the above-referenced patents, there remains a desire for further improvements. For example, the importance of minimizing coupling between the individual coils making up a phased-array is well appreciated in the art. Likewise, greater minimization of coupling between meshes is also desired for degenerate birdcage coils. That is to say, greater isolation between meshes is advantageous, and not only from immediately neighboring meshes, but also from more distant meshes (i.e., next neighbors or neighbor's neighbors). Conventional degenerate birdcage coils typically offer no better than about 10 dB of isolation, and the meshes are often only effectively decoupled from their immediate neighbor. Additionally, it is desirable to have the otherwise multiple resonance frequencies converge or degenerate to within a small percentage difference of each other. Conventional degenerate birdcage coils, contrastingly, may still have a frequency spread which is not as small as desired. Typically, conventional degenerate birdcage coils may have a frequency spread with a greater than 5% or more difference among the resonant frequencies. Also noteworthy, it the difficulty associated with tuning a degenerate birdcage coil to achieve the desired operating characteristics. Difficulty in this regard makes it advantageous to have a means for more readily tuning the coil. Accordingly, an additional degree of freedom to work with and which facilitates proper tuning is desirable.

Degenerate birdcage coils find particular relevance in parallel imaging techniques such as SENSE and SMASH imaging, and other applications. For example SENSE is based on the use of multiple RF coils and receivers. Using multiple coil elements, only a limited number of phase encoding steps are made to measure the same field of view with the same resolution: this can reduce the acquisition time by the amount of coil elements. Unlike phased-array coils however, the coil elements are not used to cover separate anatomical regions. Instead, they are used to simultaneously measure the same region, whereby the individual coil element sensitivity is used to correct for the reduction of phase-encoding steps.

Typically, sensitivity information is collected by transmitting RF signals into an examination region and receiving RF signals from the examination region alternately using first RF coil, e.g. a body coil and, a second coil, e.g. a degenerate local birdcage coil. When the first RF coil is receiving signals, the second coil is decoupled from the MR system. Likewise, when the second RF coil is receiving signals, the first coil is decoupled. Sensitivity information related to the second coil is derived from the signals received from both coils and is used for reconstructing images from signals received from only the second coil.

The present invention contemplates a new and improved birdcage coil and technique therefor which overcomes the above-referenced problems and others.

In accordance with one aspect, a birdcage coil system is disclosed for use in conjunction with a magnetic resonance imaging apparatus. A birdcage coil includes first and second conductive loops and a plurality of first conductor rungs are disposed between the first and second conductive loops that are in electrical connection therewith. A switching means is provided for switching the birdcage coil at least between an RF transmit mode and an RF receive mode. In the RF receive mode, the birdcage coil is adapted to operate as a phased array RF receive coil.

In accordance with another aspect, a birdcage coil is disclosed for use in conjunction with a magnetic resonance imaging apparatus. The birdcage coil includes first and second conductive loops, a plurality of first conductor rungs disposed between the first and second conductive loops and in electrical connection therewith, and a third conductor spaced apart from the second conductive loop and connected to the second loop at radio frequencies.

One advantage is a reduction in localized specific absorption rate.

Another advantage is the ability to perform parallel imaging techniques such as SENSE.

Another advantage is improved coil efficiency.

Yet another advantage is improved isolation of meshes of a degenerate birdcage coil.

Still further advantages of the present invention will become apparent to those of ordinary skill in the art upon a reading and understanding of the following description of the preferred embodiments.

The invention may take form in various components and arrangements of components, and in various process operations and arrangements of process operations. The drawings are only for purposes of illustrating a preferred embodiment and are not to be construed as limiting the invention.

FIGS. 7A, 7B, 7C, and 7D, taken together, form a planar view of a birdcage RF coil showing electronic circuitry therein.

Figure 3:
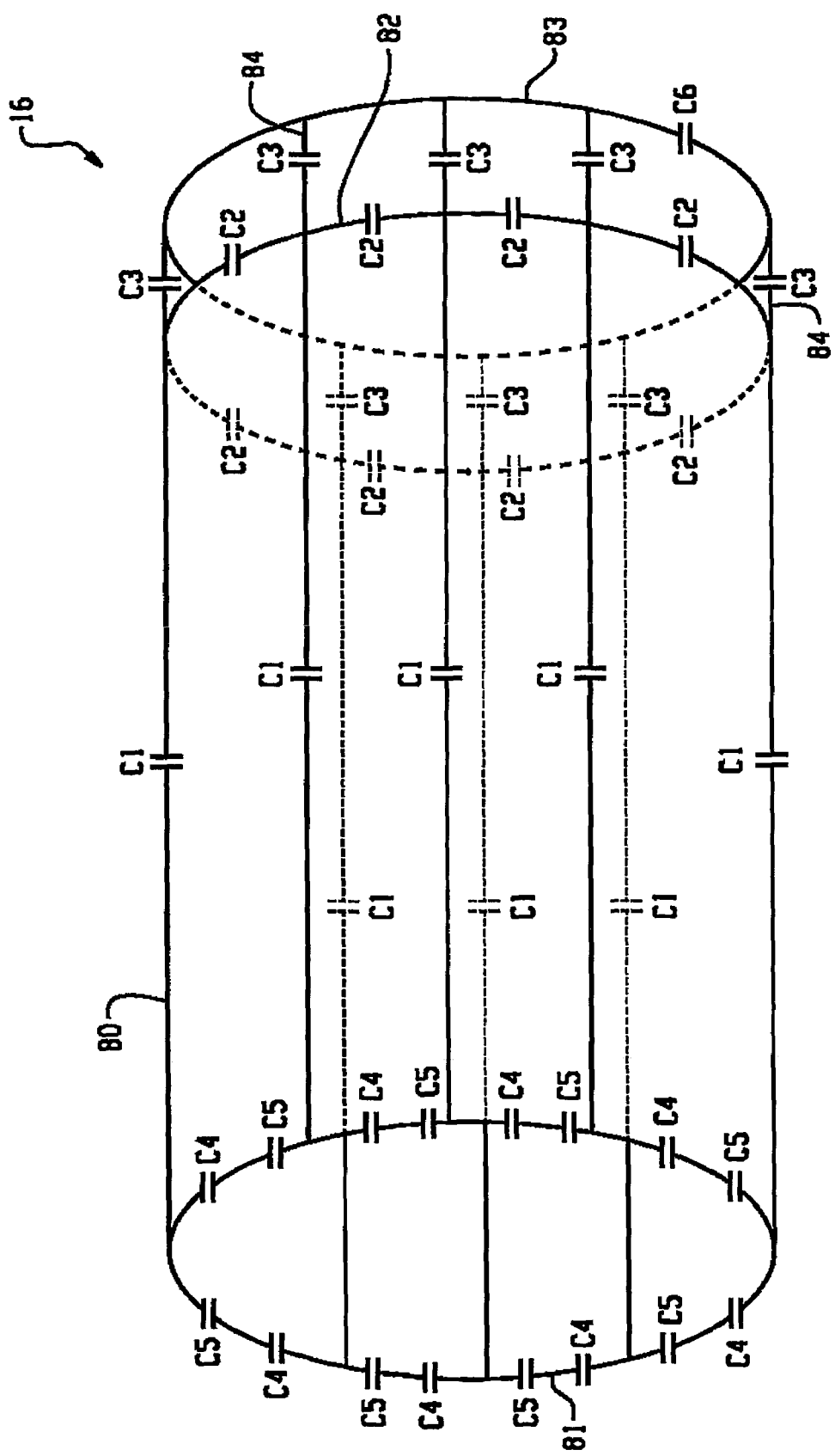
FIG. 3 is a diagrammatic illustration depicting a birdcage RF coil.
Figure 8:
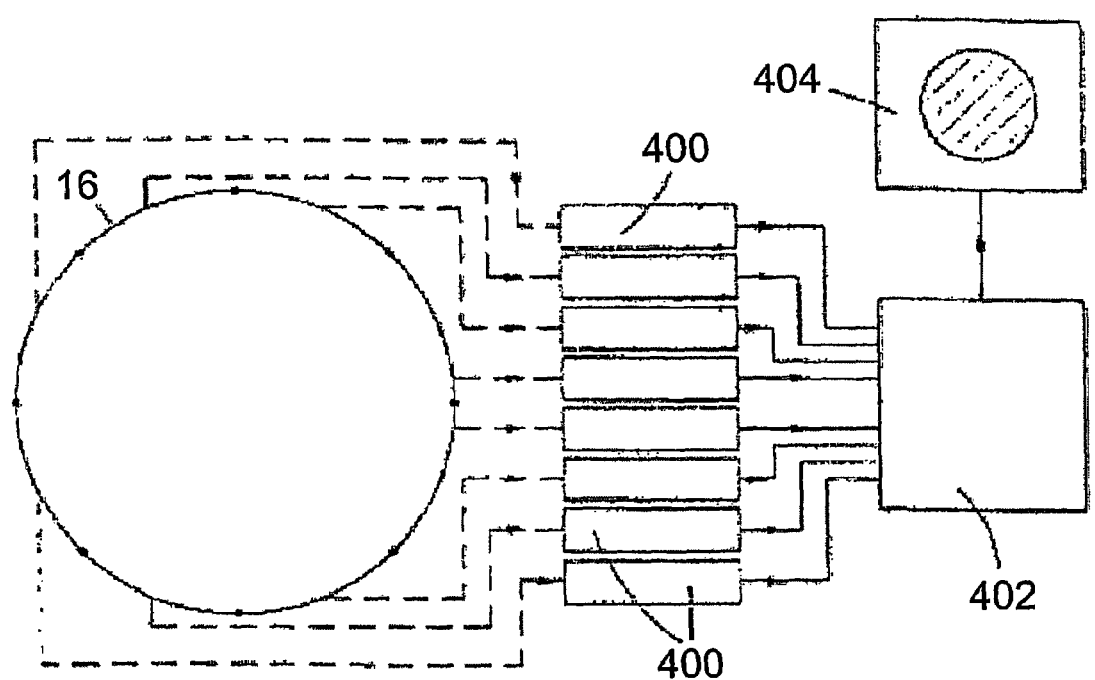

FIG. 8 is a diagrammatic illustration of connection of the birdcage coil of FIG. 3 to provide an array of radio frequency receive meshes.

Figure 9:
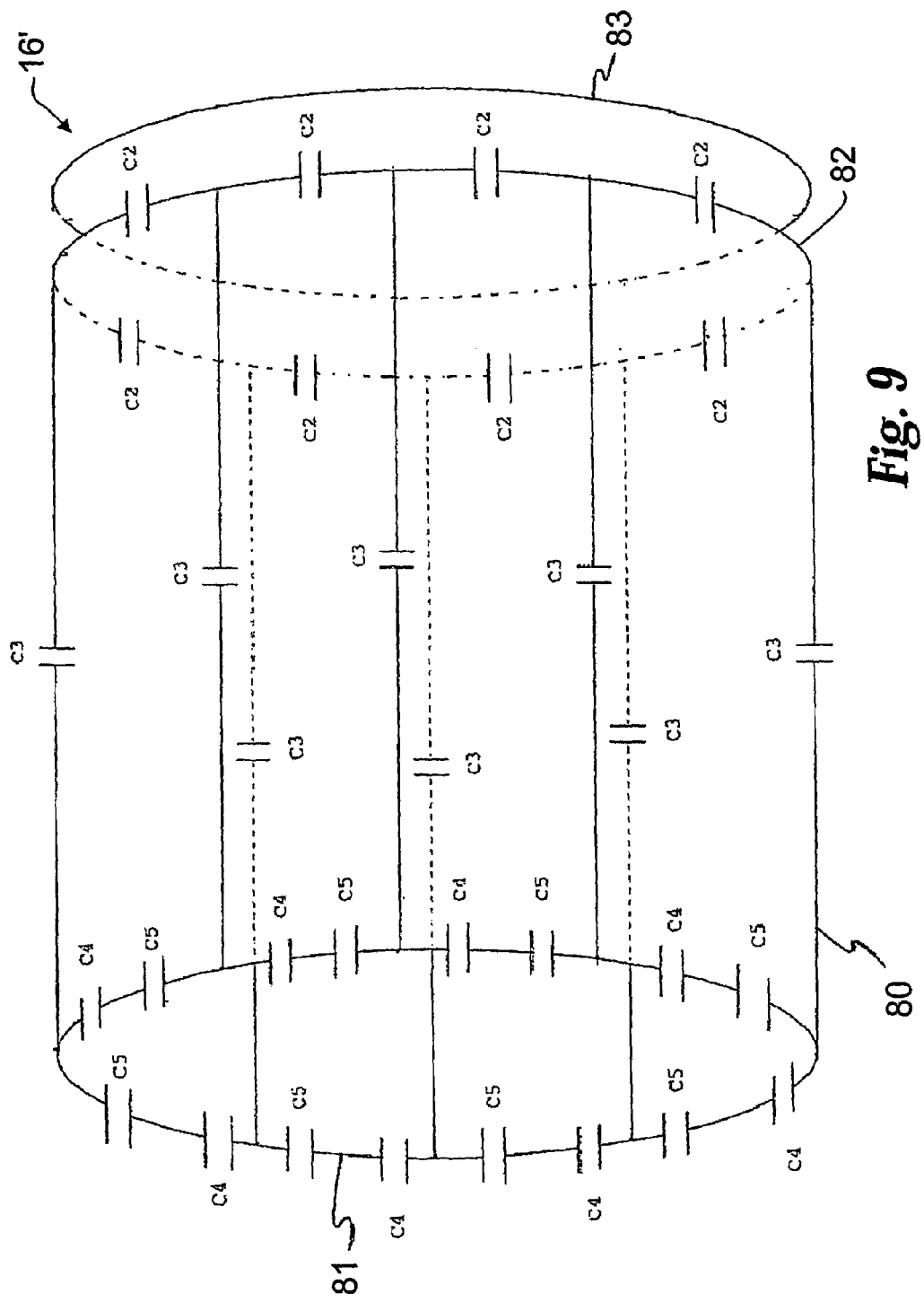

FIG. 9 is a diagrammatic illustration depicting another exemplary embodiment if a birdcage RF coil.

Figure 10:
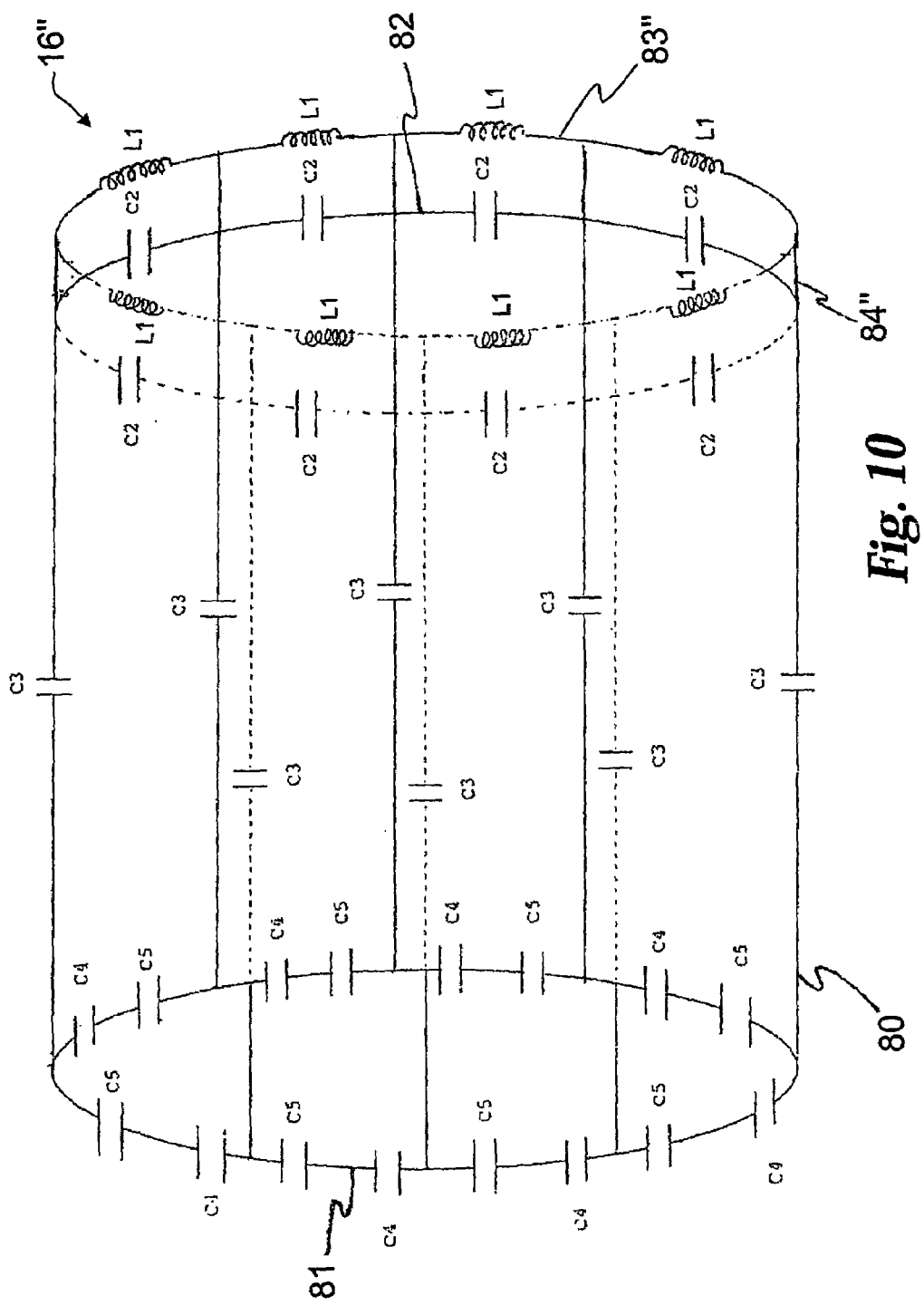

FIG. 10 is a diagrammatic illustration depicting another exemplary embodiment if a birdcage RF coil.

Figure 11:
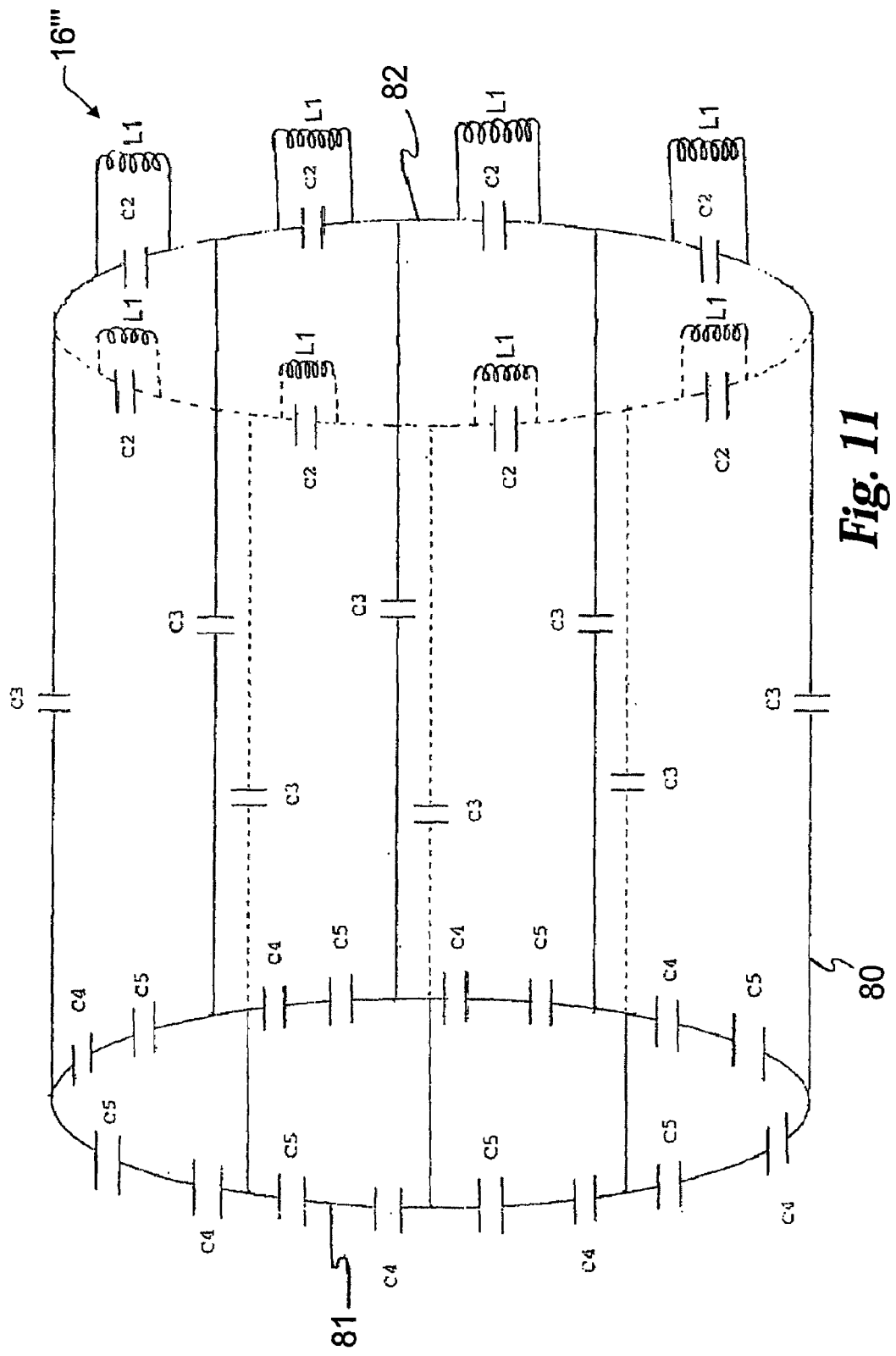

FIG. 11 is a diagrammatic illustration depicting another exemplary embodiment if a birdcage RF coil.

Figure 12:
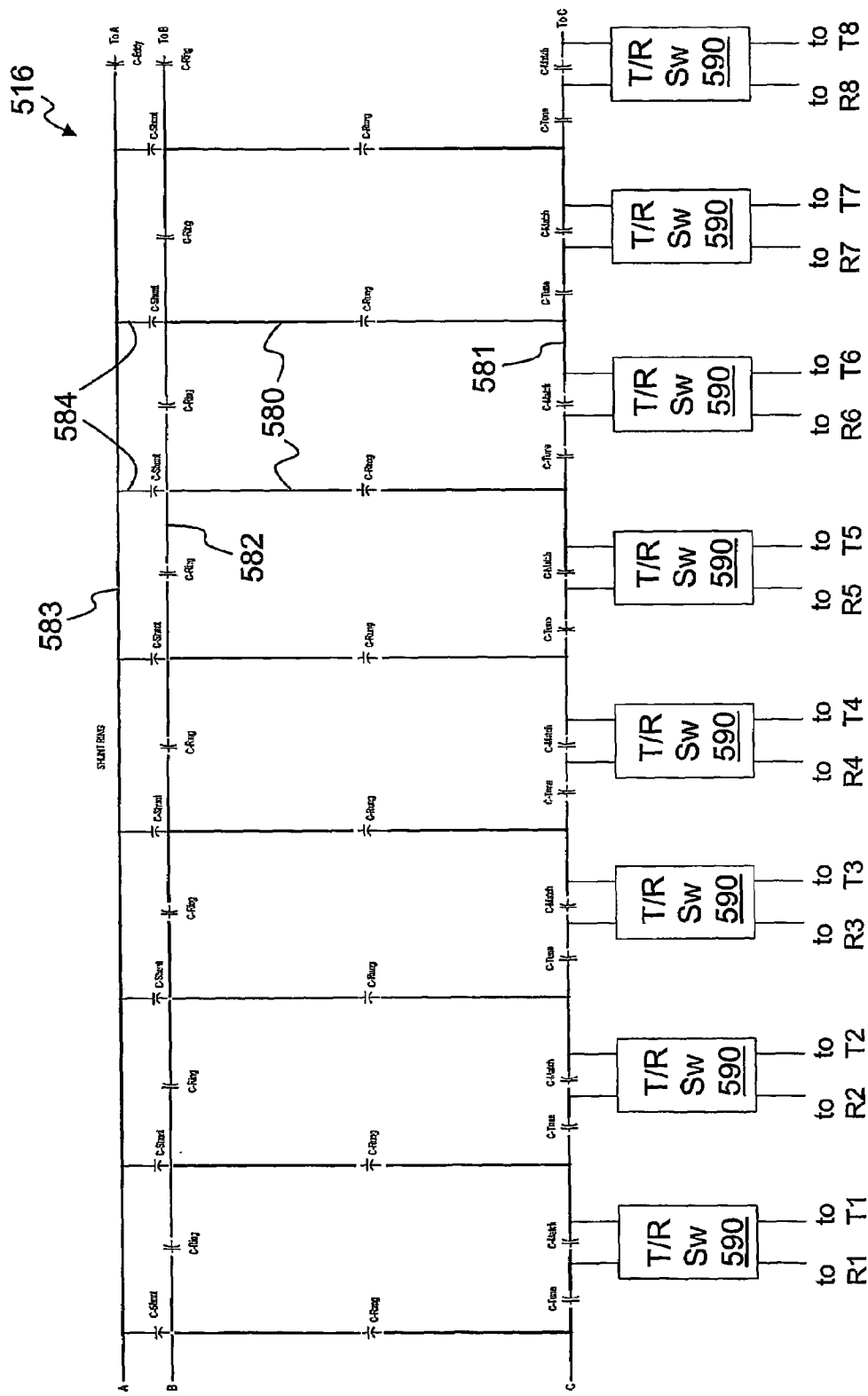

FIG. 12 is a planar view of a birdcage coil similar to the coil of FIG. 3, in which each coil loop is connected by an individual transmit/receive switch.

Figure 13:
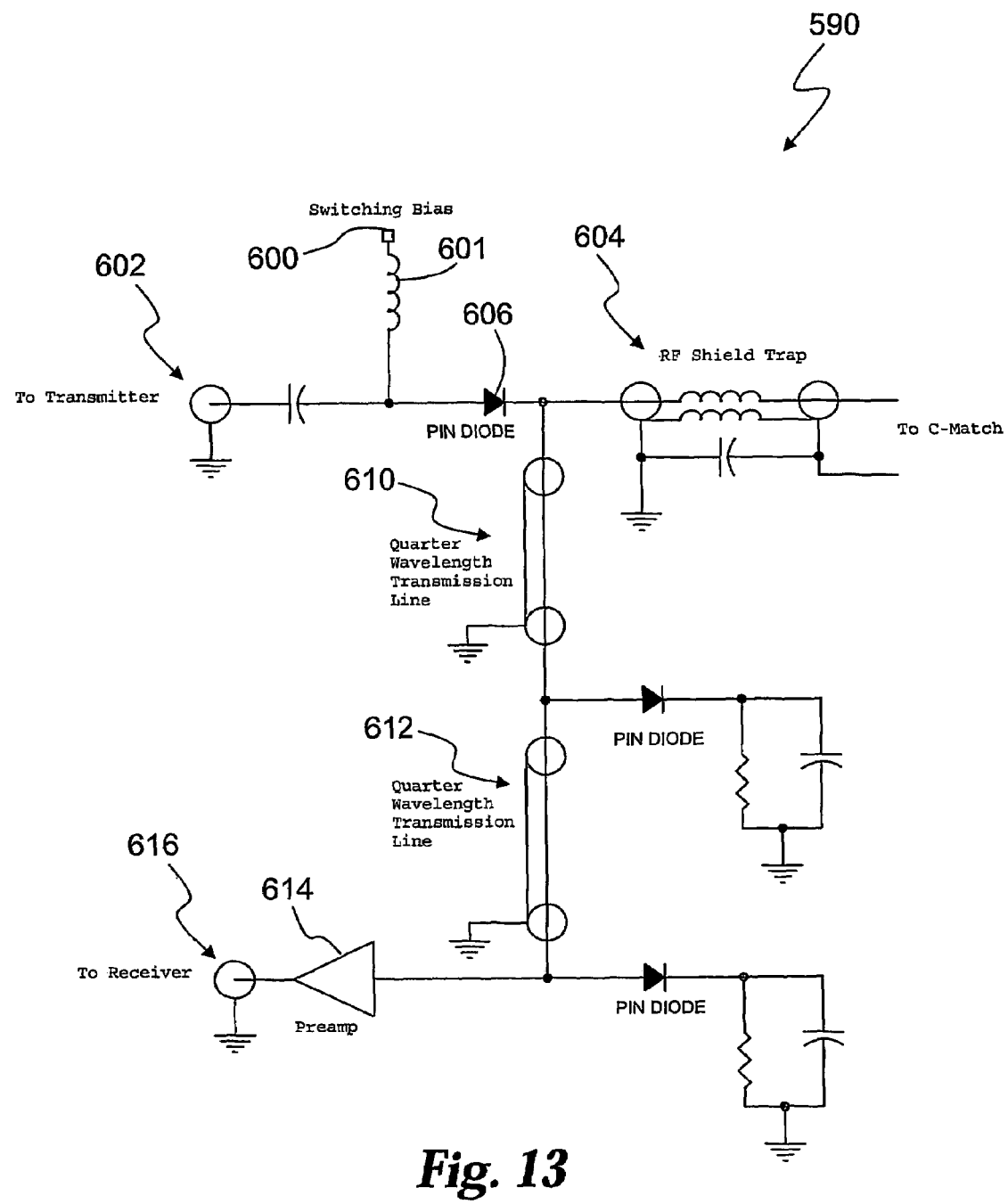

FIG. 13 is a diagrammatic illustration of one of the transmit/receive switches of FIG. 12.

Figure 1:
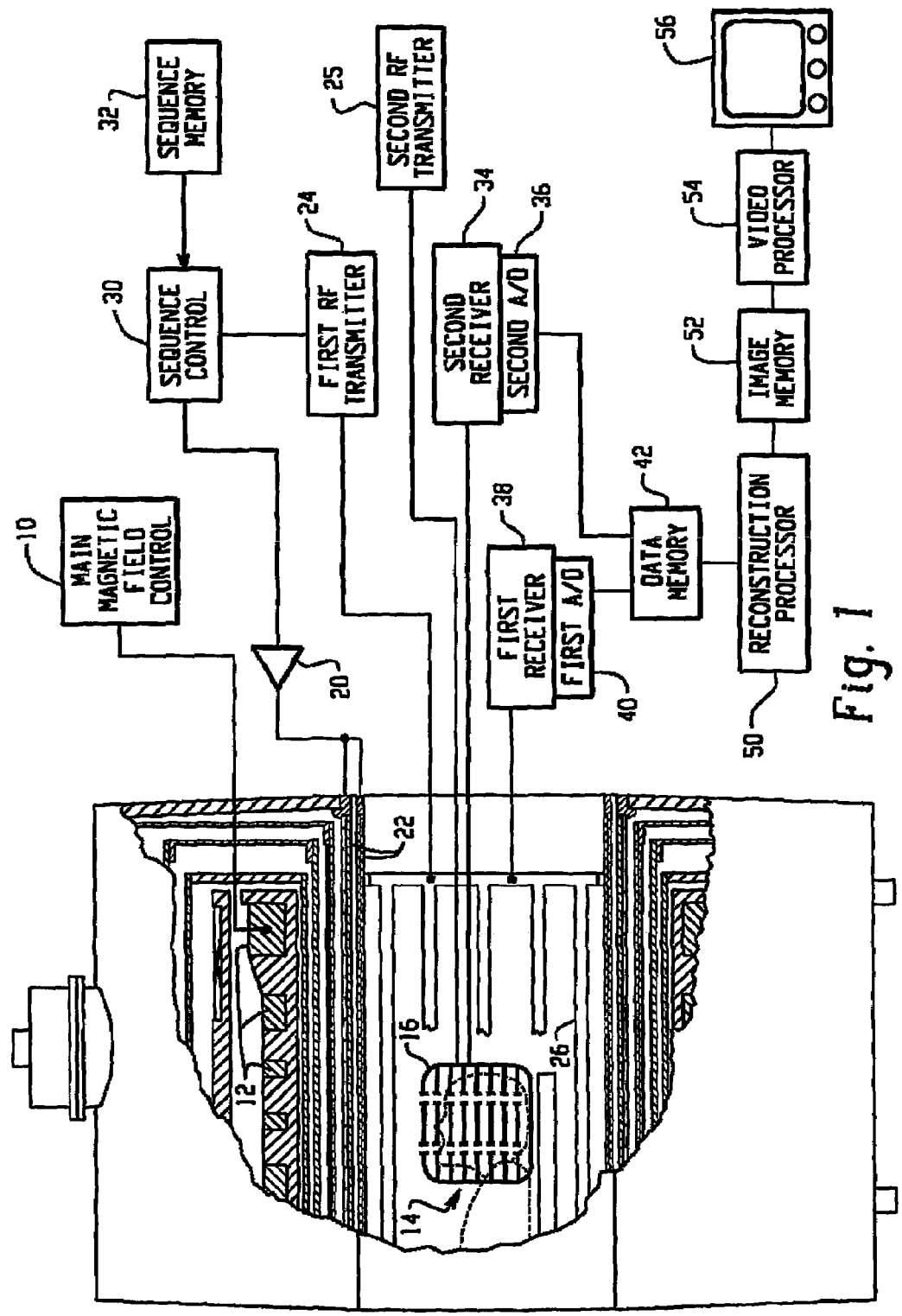
FIG. 1 is a diagrammatic illustration depicting a magnetic resonance imaging apparatus.
Figure 2:
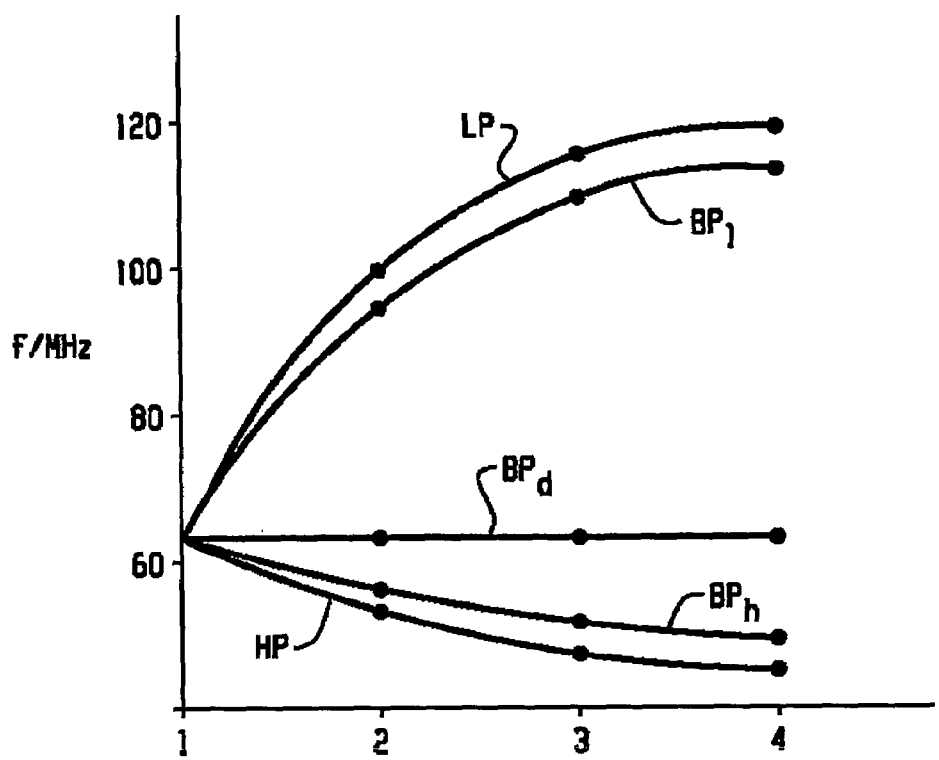
FIG. 2 is a graph which aids in describing various operational types of birdcage coils.

With reference to FIG. 1, an MRI scanner is depicted. A main magnetic field control 10 controls a main magnetic field magnet 12 such as a superconducting or resistive magnet. The main magnet 12 is controlled to generate a substantially uniform, steady main magnetic field, $B_0$, having a desired strength, for example $|B_0|=3.0$ Tesla, in an examination zone or region 14 in which an object to be examined is arranged. As shown, the examination zone 14 takes the shape of a cylindrical bore, however other shapes as well as open field examination zones are contemplated. Typically, $B_0$ is set up in the direction of a z axis which is the central longitudinal axis of the examination zone 14.

Pulse sequences are stored in a sequence memory 32 and are carried out by sequence control 30. The sequence control 30 controls a gradient pulse amplifier 20 and first and second RF transmitters 24, 25 as necessary. More specifically, the sequence control 30 controls the gradient pulse amplifiers 20 and the transmitters to produce a plurality of MRI pulse sequences that generate and gradient encode (i.e., slice, phase, and/or frequency encode) the MR signals that are ultimately received and sampled.

Gradient pulse amplifiers 20 apply current pulses to selected gradient coils 22 to create magnetic field gradients along orthogonal axes of the examination region 14. These magnetic fields extend substantially in the same direction as $B_0$ but have gradients in the x, y and/or z directions, respectively.

A digital radio frequency transmitter 24 transmits radio frequency pulses or pulse packets to a first RF coil 26, which is, for example, a whole-body birdcage RF coil, to transmit RF pulses into the examination region. A typical radio frequency pulse is composed of a packet of immediately contiguous pulse segments of short duration which taken together with each other and any applied gradients achieve a selected magnetic resonance manipulation. These RF pulses set up a $B_1$ magnetic field in the examination zone 14, at a Larmor frequency that is determined by the strength of the magnetic field and the gyromagnetic constant of the magnetic dipole species of interest. This frequency is typically approximately 63.8 MHz for a magnetic field having a strength of 1.5 Tesla, 128 MHz for a magnetic field having a strength of 3.0 Tesla, and so forth. The RF pulses are used to saturate, excite resonance, invert magnetization, refocus resonance, or otherwise manipulate resonance in selected portions of the examination region.

A second RF coil 16 is disposed in the examination region and is optionally controlled by a second RF transmitter 25 to selectively produce RF pulses in the examination region 14. As shown in FIG. 1, the second RF coil 16 is a birdcage head coil. As with the first RF coil 26, these RF pulses set up a $B_1$ magnetic field in the examination zone.

Regardless of which RF transmitter is used, a typical RF pulse is composed of a packet of immediately contiguous pulse segments of short duration, which taken together with each other and any applied gradients, achieve the selected magnetic resonance manipulation. The MRI pulse sequences employed optionally generate MR signals for either two-dimensional (2D) or three-dimensional (3D) imaging. The MRI pulse sequences employed optionally include any of a plurality of single echo or multi-echo imaging sequences. Imaging may be carried out using any number of known MRI techniques, e.g., field echo (FE) imaging, spin echo (SE) imaging, echo planar imaging (EPI), echo volume imaging, gradient and spin echo (GSE) imaging, fast spin echo (FSE) imaging, single shot FSE imaging, three-dimension volume FSE imaging, parallel imaging techniques (e.g., sensitivity encoding (SENSE), simultaneous acquisition of spatial harmonics (SMASH), etc.), and/or the like. In the case of 2D imaging, the region of interest represents a 2D cross-sectional slice through the object being imaged. In the case of 3D imaging, the region of interest represents a 3D volume of the subject being imaged.

Magnetic resonance signals arising from the examination region 14 are received by an RF receive coil disposed in proximity to the examination region. The RF receive coil can optionally be the body RF coil 26 or the local RF coil 16. A first receiver 38 receives magnetic resonance signals from the whole body RF coil 26 and demodulates the signals into a plurality of data lines. If the receiver is analog, a first analog-to-digital converter 40 converts each data line to a digital format. Alternately, the analog-to-digital converter is disposed between the radio frequency receiving coil 26 and the receiver 38 for digital receivers.

A second receiver 34 receives magnetic resonance signals from the local RF coil 16 and demodulates the signals into a plurality of lines of data. If the receiver 34 is analog, a local analog to digital converter 40 converts each data line from the local receiver into digital format. Again, the analog to digital converter can be upstream from a digital receiver. Data lines from the receiver(s) 38, 34 are arranged and stored in a data memory 42.

It is to be understood that the local coil 16 is subdivided into a number of sections or meshes (as shown eight), each of which is connected to the second receiver 34. Accordingly, the second receiver 34 may include a number of receivers and associated analog to digital converters, for example, one for each mesh of the local coil 16. Alternately, a single multi-channel receiver can be employed.

The data lines are reconstructed into an image representation by a reconstruction processor 50 which applies an inverse Fourier transform or other appropriate reconstruction algorithm. The image may represent a planar slice through the patient, an array of parallel planar slices, a three-dimensional volume, or the like. The electronic image representation is then stored in an image memory 52 where it is selectively accessed by a video processor 54 that converts slices, projections, or other portions of the image representation into appropriate format for a display, such as a monitor 56 which provides a human-readable display of the resultant image.

With reference to FIG. 3, the local RF coil 16 is shown in greater detail. The local RF coil 16 can be operated as a transmit/receive birdcage coil which can operate as a quadrature transmit coil and as a phased array receive coil. As shown, the phased array includes eight isolated coils, or meshes. Additionally, the local RF coil 16 is capable of being decoupled from the MR system for sequences in which only the body RF coil 26 is used as a receive coil.

As shown, the local birdcage coil 16 is constructed so as to be generally rotationally symmetrical relative to a symmetry axis extending in the z direction and includes first, second, and third radio frequency conductors or loops 81, 82 and 83 which are arranged coaxially with the symmetry axis and in planes extending substantially normal thereto. In the illustrated embodiment, the loops are of substantially equal diameter. The first and second conductor loops 81 and 82 are electrically interconnected via first conductor rungs 80. As shown, there are eight rungs 80, however, other even numbers of similar conductors may be employed. Each of these rungs 80 includes a first rung capacitor C1. The first and second loops 81 and 82 are divided into segments or arcs defined between their respective connections with the rungs 80. Each of the segments of the first conductor loop 81 includes a tuning capacitor C4 and a matching capacitor C5. Similarly, each segment of the second conductor loop 82 includes a second loop capacitor C2. Two neighboring rungs 80 and the segments of loops 81 and 82 situated therebetween define a single mesh.

In the illustrated embodiment, the end conductor is a loop. However, other end conductors are contemplated, such as an end cap or plate, other capacitive or reactive circuits, and the like.

The third loop 83 is electrically interconnected via second conductor rungs 84 to loop 82. As shown, there are eight second conductor rungs 84, however, other even numbers of similar conductors may be employed. The second rungs 84 are equal in number to the first rungs 80, and they connect to second loop 82 at substantially the same point as the first conductors 80. Optionally, the first and second conductor rungs 80 and 84 form single substantially straight conductive elements that electrically intersect the loop 82 while their ends electrically join to first and third conductors 81 and 83, respectively. Each of the second conductor rungs 84 includes a second rung capacitor C3. Optionally, disposed within the third conductor 83 is an eddy current capacitor C6 to address gradient eddy current build up in the coil 16.

Figure 4:
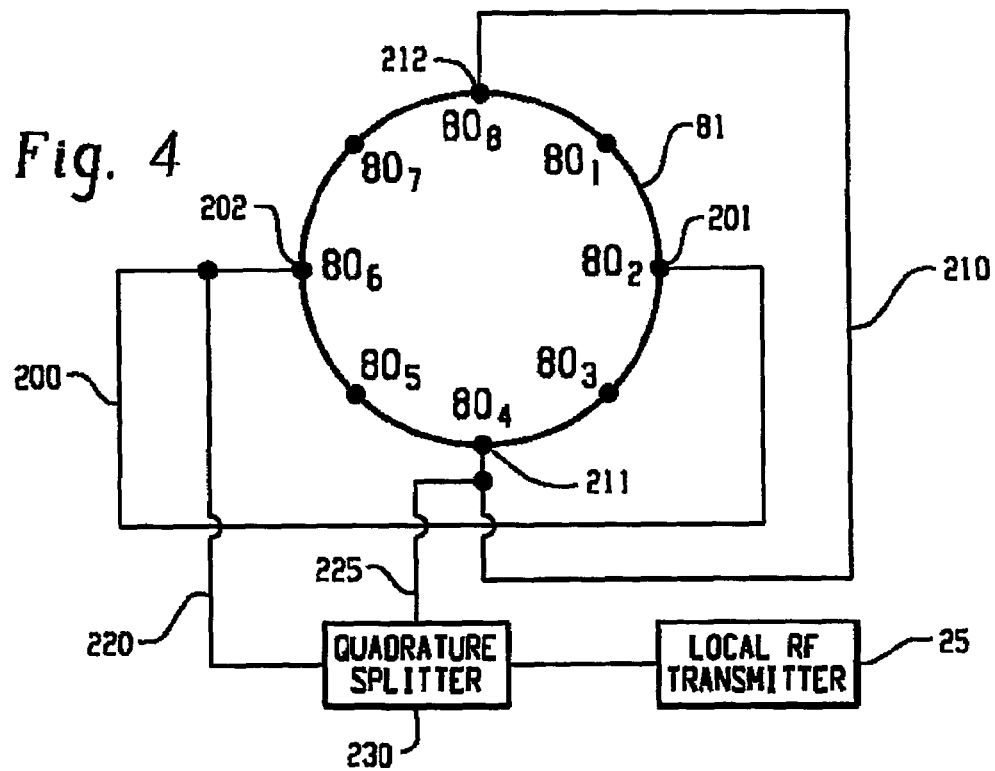
FIG. 4 is a diagrammatic illustration of an arrangement for transmitting RF signals to a birdcage coil.

Turning to FIG. 4, an end view of the first conductor loop 81 is shown, along with individual first conductor rungs $80_1$, $80_2$, ... $80_8$ which run into the page. For the purpose of quadrature transmission, the second (i.e. local) RF transmitter 25 is connected to a quadrature splitter 230 for generating two RF transmit signals that have a substantially ninety degree out of phase relationship. The two RF signals are transmitted to the local RF coil 16 via first and second coaxial cables 220, 225, as shown in FIG. 4. The first coaxial cable 220 is coupled to a first half-wavelength coaxial cable 200 which is, in turn, connected to the local RF coil 16 at two feed points 201, 202 on loop 81. These two feed points are in electrical connection with first conductor rungs $80_2$ and $80_6$. The second coaxial cable 225 is electrically coupled to a second half-wavelength coaxial cable 210 which is, in turn, electrically connected to the local RF coil 16 at feed points 211 and 212. These latter two feed points are in electrical connection with first conductor rungs $80_4$ and $80_8$. While a four-point feed arrangement is shown in FIG. 4, just two feeds could be used or alternately, more than four feed points could be implemented.

Figure 5:
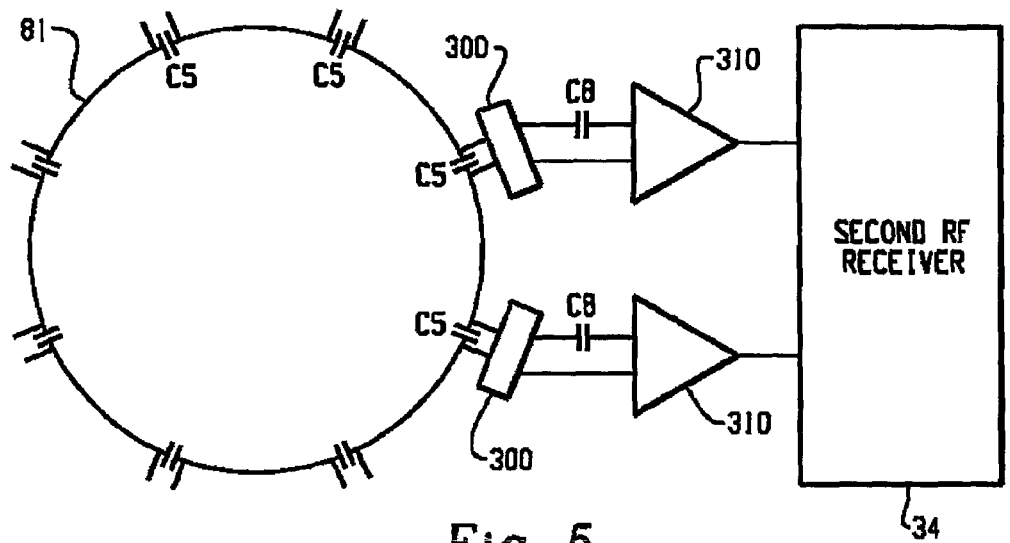
FIG. 5 is a diagrammatic illustration of an arrangement for feeding MR signals from a birdcage RF coil to processing channels.

FIG. 5 illustrates how received RF signals can be taken from the individual meshes. Again, an end view of the first conductor loop 81 is shown. Each of the capacitors C5 serves as a matching capacitor across which a feed balun 300 is placed. The baluns are butterfly baluns or another suitable type of balun. Note, for clarity purposes, the C4 capacitors are not shown in FIG. 5, and only two take-off arrangements are shown. It is to be appreciated that the other C5 capacitors have similar takeoff arrangements.

Each balun 300 is routed to a high-impedance amplifier or preamp 310 via capacitors C8 that provide preamp isolation. Because the C5 capacitors are each associated with only one respective mesh, the voltage across a particular C5 capacitor represents the MR signal induced in that mesh. The MR signals derived from the C5 capacitors are then applied to the second (i.e. local) RF receiver via a respective one of the amplifiers 310.

Figure 6:
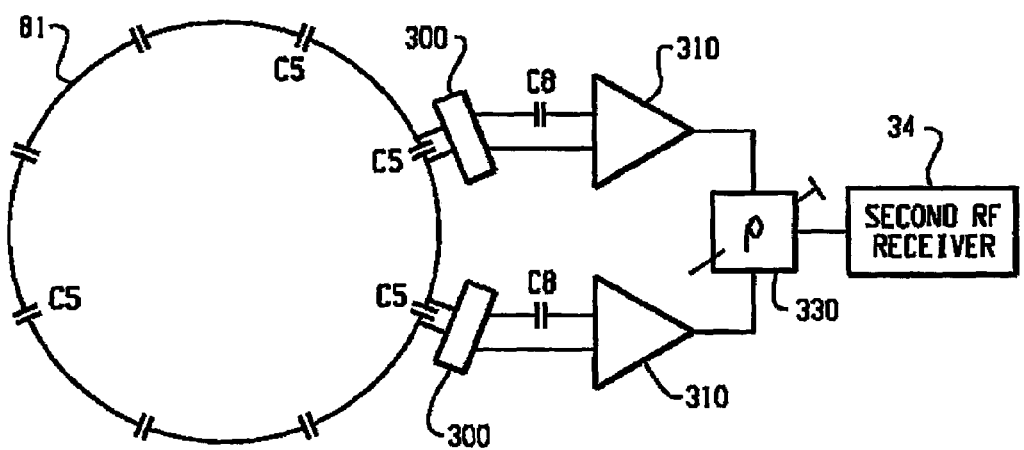
FIG. 6 is a diagrammatic illustration of another arrangement for feeding MR signals from a birdcage RF coil to processing channels.
Figure 7A:
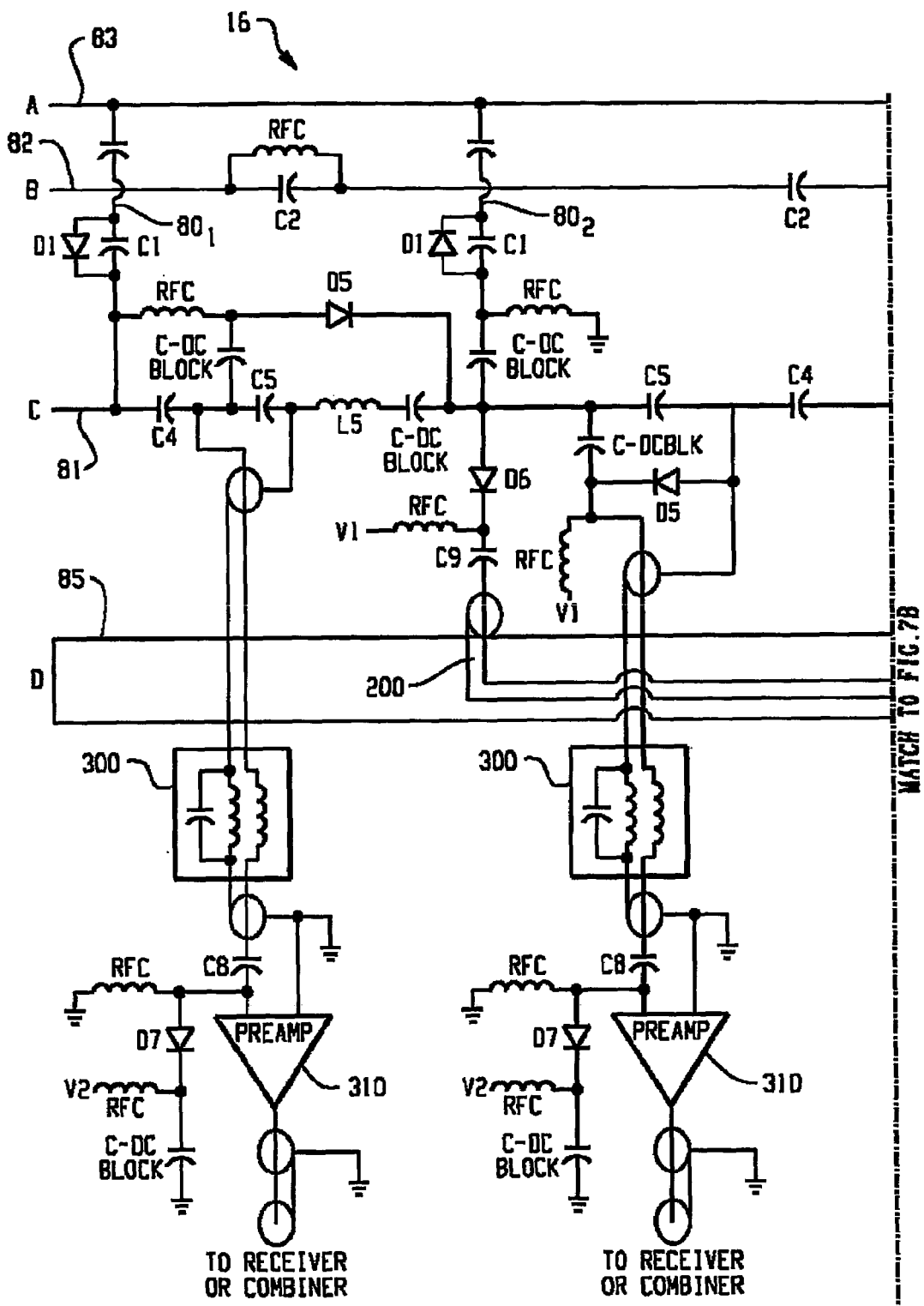
Figure 7B:
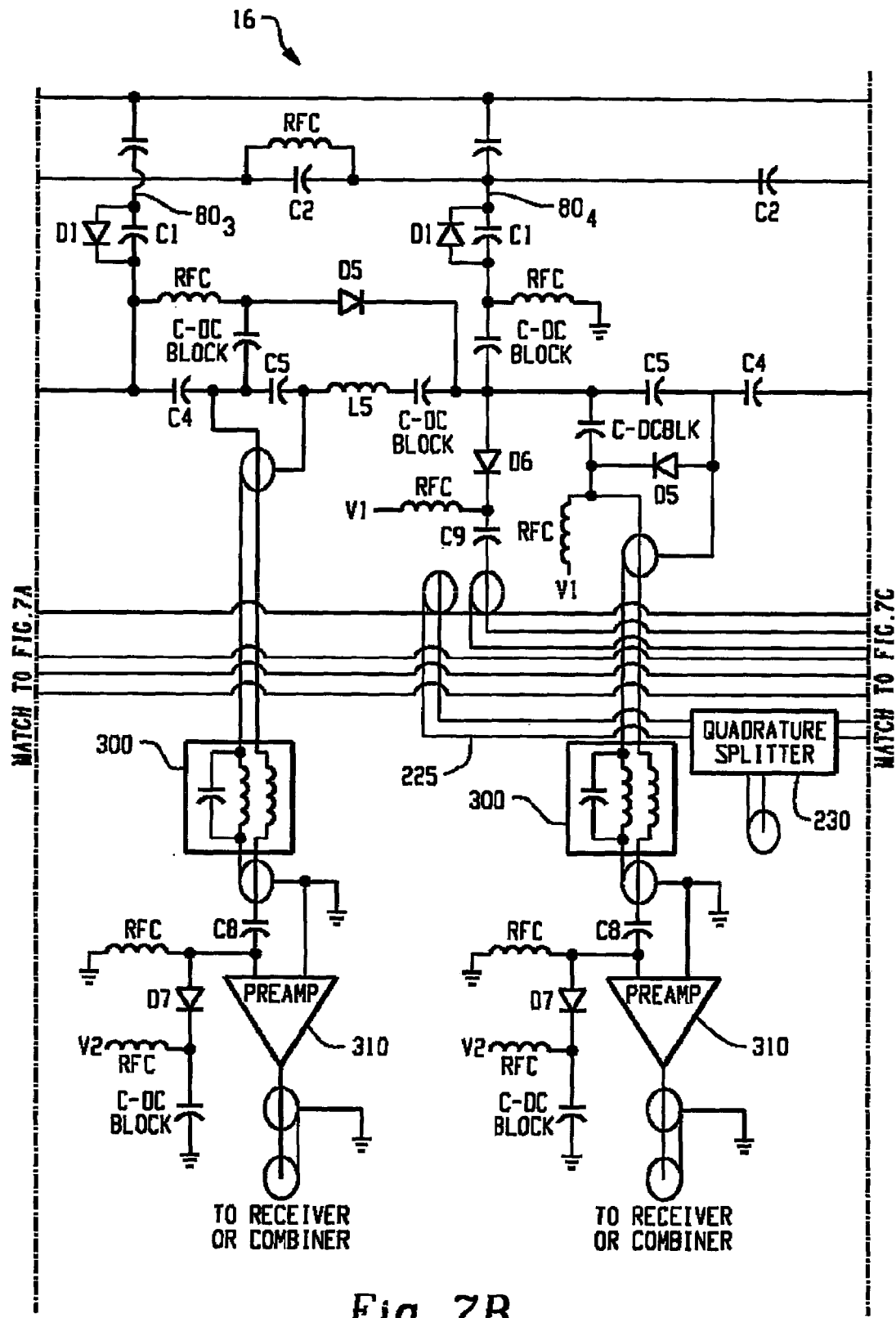
Figure 7C:
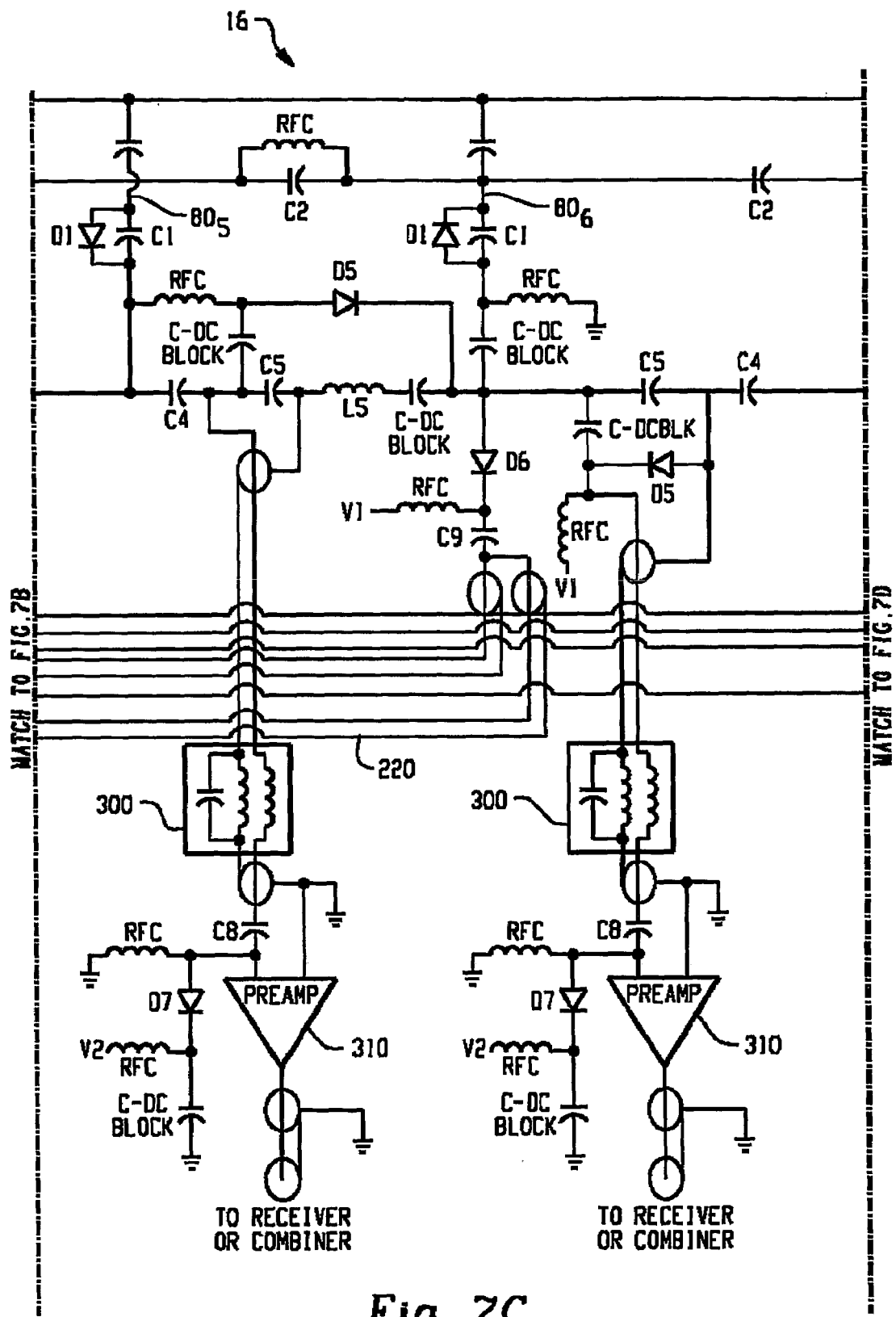
Figure 7D:
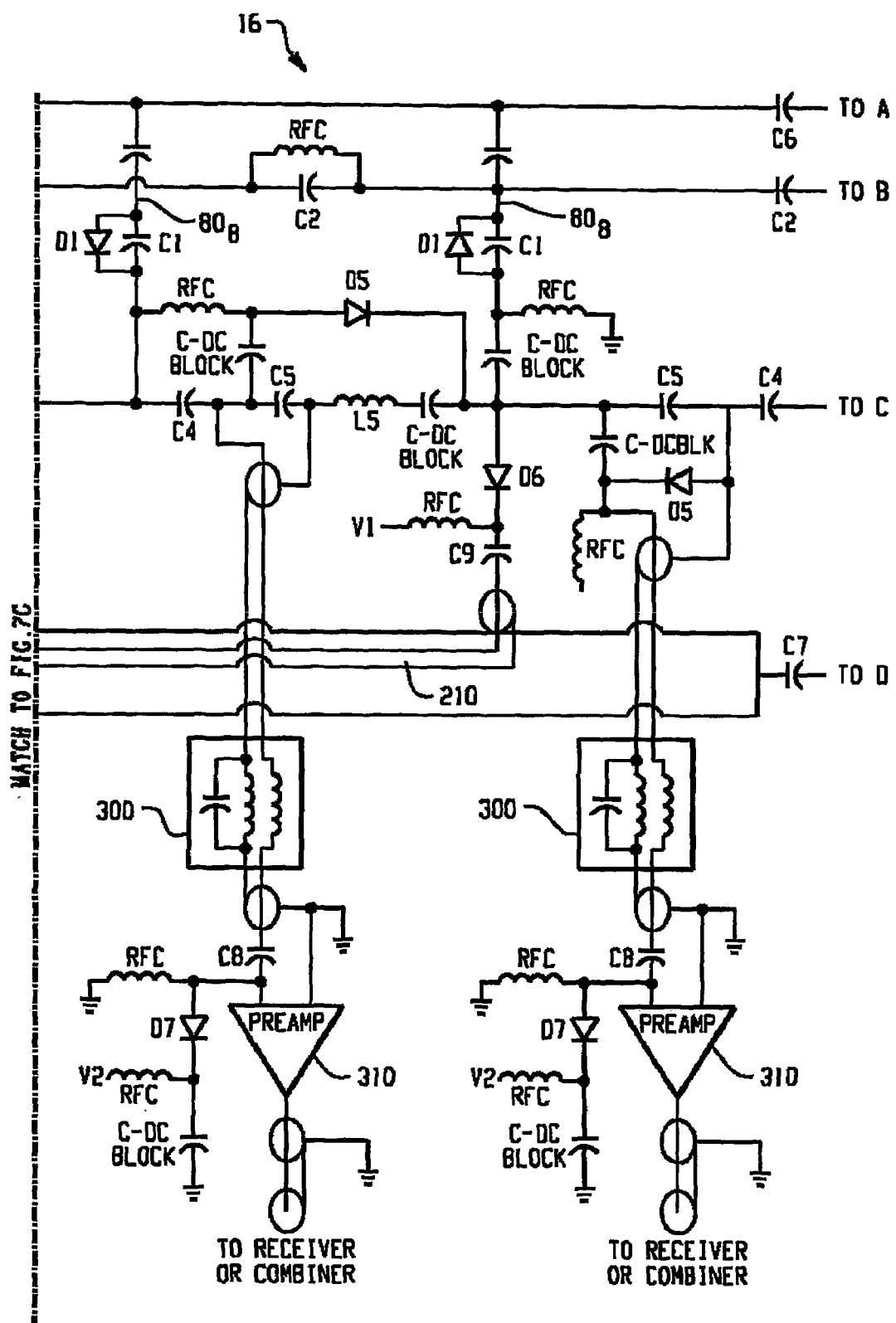

With reference to FIG. 6, an alternate feeding arrangement is illustrated which advantageously reduces the number processing channels 320 employed. That is to say, the embodiment of FIG. 5 employs a number of processing channels equal to the number of meshes incorporated in the coil, while the embodiment of FIG. 6 employs a number of processing channels 320 less than the number of meshes incorporated in the coil 16. Note, for clarity purposes, the C4 capacitors are not shown in FIG. 6, and the feeding arrangement for only two of the C5 capacitors is shown. It is to be appreciated that the other C5 capacitors have similar feeding arrangements.

FIG. 6 shows an embodiment in which pairs of processing channels 320 are combined, thereby using only half the number of processing channels 320 that would otherwise be used, e.g., in the FIG. 5 embodiment. However, more processing channels 320 may be combined in a similar fashion.

As shown in FIG. 6, the MR signals from two neighboring meshes are applied, via a respective amplifier 310, to the inputs of a phase shifter 330 such as a combination circuit. The combination circuit 330 adds the signals present at its two inputs with an adjustable phase shift. The output signal of the combination circuit 330 is then processed by a processing channel 320. The image formed from the MR data from the individual processing channels 320 has an optimal attainable signal-to-noise ratio in areas whose position is dependent on the phase with which the MR signals from two meshes are combined. Therefore, this optimum is selectively shiftable to preferred areas by changing the phase position.

Continuing with FIGS. 3–6 and with more specific reference to FIG. 7, circuitry of the local birdcage coil 16 is shown in planar view. As will be appreciated, in operation, the coil is formed around a longitudinal axis such that points A, B, C, and D, on the left side of FIG. 7 are connected to points A, B, C, and D on the right side of FIG. 7, thereby forming the generally cylindrical birdcage coil 16.

It may be desirable to have available, in addition to a coil array having a substantial location-dependent sensitivity (e.g., the degenerate birdcage coil), a coil which has a substantially uniform sensitivity in the examination zone 14, such as that which is achieved with a conventional birdcage coil. To this end, the capacitors C1 in the first conductor rungs 80 and in the first and second conductor loops 81, 82 are optionally switched over by means of switching units, e.g., controllable switches such as PIN diodes D1 or the like which are arranged in parallel with or otherwise bridge the respective capacitances to thereby short-circuit the same when closed. By selectively closing and opening the respective switches, birdcage coils of different electrical behavior can thus be obtained. Accordingly, switching over between different birdcage coil types (i.e., transmit, receive, low-pass, high-pass, band-pass or degenerate, or decoupled) may be done without having to exchange physical coils.

Accordingly, in each first conductor rung 80, first rung PIN diodes D1 are arranged in parallel with capacitors C1. As can be seen, PIN diodes in adjacent rungs are arranged in opposite directions from one another. In each segment of the first conductor loop 81 is a matching PIN diode D5 arranged in parallel with matching capacitor C5. First and second half-wavelength coaxial cables 200, 210 are connected to their respective feed points 201, 202, 211, 212 via transmit PIN diodes D6 and transmit matching capacitors C9. As can be seen, the transmit coaxial cables are grounded to ground ring 85. Disposed within ground ring 85 is a second eddy current capacitor C7 to deal with eddy current build-up in the coil. The switch assembly switches between transmit, receive, and decoupled mode based on DC biasing potentials applied at cage voltage input V1 and preamp voltage input V2.

In one embodiment of the local birdcage RF coil 16, the rung conductors 80, 84 and conductors or loops 81, 82, 83 include copper tape or strips having a width of approximately 1.0 cm and a thickness of approximately 0.009 cm that are arranged on a suitably electrically insulating cylindrical support member. In applications for imaging particular anatomy, such as the head, the first rungs 80 may have a length of approximately 12.0 cm and the conductor loops a diameter of approximately 25.0 cm. In other applications, the length of the first rung conductors 80 may be approximately 24.5 cm and the loop diameter may be approximately 23.0 cm. The second rung conductors 84 may be approximately 2.0 cm in length and are optionally less than 1.0 cm in length. In any event, the dimensions referred to herein are merely exemplary and may be appropriately changed to varying degrees to suit particular applications.

The capacitances are selected to achieve the desired level of resonance frequency degeneration and isolation between the meshes. In one embodiment, the resonance frequencies of the coil 16 converge or degenerate to within less than 5% difference between one another. In another embodiment, the resonance frequencies of the coil 16 converge to within less than or equal to 2% difference between one another. With the addition of preamplifier decoupling, mesh isolation can be greater than 20 dB.

For example, in an experiment using the birdcage coil 16 constructed with the aforementioned copper tape dimensions, having eight first rung conductors 80 with a length of 24.5 cm, loop diameters of 23.4 cm for conductors 81, 82 and 83, and eight second rung conductors 84 with a length of 2.0 cm, and with C1=45.8 pf, C2=56 pf, C3=4.7 pf, and C4+C5=56 pf, the spread in the normal mode frequencies was measured to be approximately 980 kHz centered about 65 MHz, and the isolation achieved was greater than 18 dB with preamplifier decoupling. Accordingly, it has been found that the addition of the third ring or conductor 83 in the manner provided supports improved mesh isolation and resonant frequency degeneration. Further, the third ring or conductor 83 provides an additional degree of freedom for tuning the coil.

Note, capacitors C4 and C5 were combined into a single first loop capacitance for the experimental example. Optionally, they are combined in practice. When separated, however, the C5 capacitors serve as match capacitors for feeding the receiver channels 320, and the C4 capacitors serve as an instrument for fine tuning the coil.

In operation, a main magnetic field $B_0$ is generated in the examination region 14 and a subject is placed therein. A series of RF and magnetic field gradient pulses are applied to invert or excite magnetic spins, induce magnetic resonance, refocus magnetic resonance, manipulate magnetic resonance, spatially and otherwise encode the magnetic resonance, to saturate spins, and the like to generate MRI pulse sequences. More specifically, the gradient pulse amplifiers 20 apply current pulses to selected ones or pairs of the gradient coils 22 to create magnetic field gradients along x, y, and z axes of the examination region 14. The whole body RF transmitter 24 drives the whole body RF transmit coil 26 to transmit RF pulses or pulse packets into the examination region 14. Alternately, the local RF transmitter 25 similarly drives the local RF coil 16 to transmit RF pulses or pulse packets into the examination region 14.

With respect to the above-mentioned RF transmissions, in its first mode of operation, the local birdcage coil 16 transmits RF pulses into the examination region. When the local RF coil 16 is used in transmit mode, the coil is operated as a quadrature transmit coil. In the transmit mode, a negative potential is applied at the cage voltage input V1 and the preamp voltage input V2. This negative potential at V1 and V2 result in transmit PIN diodes D6, matching PIN diodes D5, first rung PIN diodes D1, and preamp PIN diodes D7 being forward biased. The resulting coil structure is a four-point fed high pass birdcage. The feeds of the birdcage are connected to the coil via the transmit PIN diodes D6. Matching diode D5 shorts receive tuning inductor L5 and matching capacitor C5 as shown in FIG. 7. This tunes the birdcage while applying a level of protection to the preamp 310. First rung PIN diode D1 shorts first rung capacitor C1 to make the coil a high pass birdcage. Preamp diode D7 shorts the input of the preamp 310, providing another level of protection to the preamp. The third conductor or loop 83 (that supports the degenerate birdcage mode) has a negligible affect in this mode. The radio frequency chokes RFC and DC blocking capacitors C-DCBlock serve to ensure proper DC bias. The quadrature splitter 230 provides two transmit signals ninety degrees apart to excite the birdcage in quadrature.

Regardless of the MRI pulse sequence or technique employed, the sequence control 30 coordinates the plurality of MRI pulse sequences that generate the MR signals that are ultimately received from the examination region. For the selected sequence, each echo of the received MR signal is received by the first RF coil 26 or the local RF coil 16.

In the case where the local RF coil 16 serves to receive the signals from the examination region, the local coil operates in a second mode of operation. In this mode, the local RF coil 16 serves as a phased array receive coil which includes, for example eight loop coils, or meshes. DC biasing potentials at cage voltage input V1 and preamp voltage input V2 are positive, thereby reverse biasing all diodes. In this mode the correct reactances are selected at second rung capacitors C3, second loop capacitors C2, first rung capacitor C1, tuning capacitor+receive tuning inductor L5, and matching capacitor C4 to yield a degenerate eight-channel birdcage. Turning off transmit PIN diode D6 fully isolates the transmit section from the birdcage. All eight loop coils are sufficiently isolated and can be taken to separate receivers, as shown in FIG. 5, for optimal SENSE, or other parallel processing imaging. Alternately, the signals can be combined at the preamp outputs to any number from one to eight as shown in FIG. 6.

In the case where the first RF coil 26 serves to receive the signals from the examination region, the local coil operates in a third mode of operation. In this mode, the local RF coil 16 is decoupled from the MR system as it is desirable for only the first RF coil 26 to receive RF signals from the examination region 14. In this mode the DC biasing potential at cage voltage input V1 is positive while that at preamp voltage input V2 is negative. Accordingly, all the cage diodes are left in receive or degenerate mode, while preamp diode D7 is biased on. Preamp capacitors C8 are selected such that the combination of the matching capacitors C5, the coaxial baluns 300, and the preamp capacitors C8 result in a high impedance at matching capacitor C5. This decouples the local RF coil 16, allowing for RF receive by the first RF coil 26.

Regardless of which coil serves as the RF receive coil, the received MR signal is sampled a plurality of times by the associated RF receiver 38, 36 and analog to digital converter 40, 36, resulting in data lines or arrays of sampled data points representing each echo. This raw MR data is then loaded into the MR data memory or buffer 42. The MR data memory represents the data matrix commonly know as k-space. Based upon the particular gradient encoding imparted to each echo, the corresponding MR data is mapped to or otherwise assigned a location in k-space.

The data are reconstructed into an image representation by a reconstruction processor 50 which applies an inverse Fourier transform or other appropriate reconstruction algorithm. The electronic image representation is then stored in an image memory 52 where it is selectively accessed by a video processor 54 that converts slices, projections, or other portions of the image representation into appropriate format for a display, such as a monitor 56 which provides a human-readable display of the resultant image.

The coil 16 has been described on the basis of an embodiment involving eight conductors 80, 84, i.e., eight meshes. However, it is also possible to use a different even number of conductors or meshes, for example sixteen or thirty-two. It may also be advantageous to add capacitances in the segments or arcs of the third ring or conductor 83, particularly in the case of meshes numbering between eight to sixteen. Similarly, a fourth or more conductive loops may be beneficially added in similar fashion to the third loop 83, particularly in the case where the meshes number around thirty-two. The fourth or further added conductive loops may be added to either end of the coil 16. However, due to physical constraints, it may be preferable to add fourth or further conductive loops to the same end as the third conductor 83, thereby leaving the conductor 81 free for feeding the MR signals to the processing channels. The introduction of the fourth or additional loops, while increasing complexity, can also have the beneficial effect of adding yet further degrees of freedom for coil tuning.

With reference to FIG. 8, an illustration of connection of the coil 16 as a receive coil array is show. The MR signals are received by the coil 16. The coil 16 is subdivided into a number of sections or meshes (eight in the illustrated coil 16), each of which is connected, as denoted by dashed lines in the arrangement of FIG. 8, to a separate signal processing channel 400. In each processing channel 400, the received MR signal is demodulated, decoded and digitized to generate MR data which represents the nuclear magnetization distribution in the area covered by the respective mesh. For example, by means of an inverse Fourier transformation and/or other appropriate algorithms, the respective MR data is reconstructed and/or combined by a reconstruction unit 402 to form an image which represents the nuclear magnetic dipole distribution in the object and/or space surrounded by the coil 16. After reconstruction, the image is formatted for presentation on a display 404, such as a video monitor or other human viewable display or output device that selectively provides a depiction of the resultant image or images. The formatted image is optionally a surface rendering, 3D volume, 2D cross-section or other visual representation of the object. Each processing channel 400 optionally includes a receiver for demodulating, decoding and/or digitizing the MR signal detected by its corresponding mesh. Alternately, a single multi-channel receiver is employed.

With reference to FIG. 9, an alternate embodiment of the degenerate birdcage coil 16' is shown. In this embodiment, the second conductor rungs 84 and the capacitors associated therewith are omitted. That is to say, in the coil 16' the third conductor loop 83 is not electrically connected to conductor loop 82 via physical electrical connections. Rather, the third conductor loop 83 is arranged in such proximity to the conductor loop 82 so as to be capacitively and/or inductively coupled thereto. This capacitive/inductive coupling substitutes for the second conductor rungs 84 and their associated capacitors. Additionally, it is be appreciated that while the third loop 83 is shown beside loop 82, the third loop 83 optionally has a diameter slightly smaller or larger than loop 82 such that the loop 83 may be arranged concentrically with loop 82. If arranged inside loop 82, the conductor 83 can be a loop or disc, for example.

FIG. 10, shows yet another embodiment of the degenerate birdcage coil 16" in which second conductor rungs are retained, but the capacitances C1 have been omitted from conductor rungs 84", and in lieu thereof, inductors having inductances L1 have been added in the segments of the third conductor loop 83".

To somewhat similar effect, in still yet another embodiment of the degenerate birdcage coil 16''' the third loop 83 is omitted altogether and the L1 inductors arranged in parallel with the C2 capacitors as shown in FIG. 11. However, omitting the third loop 83 removes the mutual coupling of a third loop with the second loop 82, and can disadvantageously impact the additional degree of freedom for coil tuning gained by the additional third loop.

With reference to FIGS. 12 and 13, a degenerate birdcage coil 516 including first conductor rungs 580, first, second, and third conductors or loops 581, 582, 583, and second conductor rungs 584 is similar to the birdcage coil 16. As in the birdcage coil 16, the reactances of the conductor rungs 580, 584 and of the conductor loops 581, 582 are selected such that the birdcage coil 516 is a degenerate coil in which meshes defined by neighboring rungs 580 and connection portions of the loops 581, 582 are substantially decoupled at least from nearest neighbor and next-nearest neighbor meshes. Each mesh is operatively connected with a separate transmit/receive (TIR) switch 590 dedicated to operating that mesh. The ratio of rung, ring, and shunt capacitors C-Rung, C-Ring, and C-Shunt of the coil 516 are selected to yield high loop-to-loop isolation at the operating frequency. The use of separate T/R switches 590 for each mesh allows current in the various meshes to be independently controlled. The degenerate coil has substantially decoupled nearest neighbor meshes. The use of the third conductor loop 583 provides substantially improved mesh isolation versus a two-loop degenerate birdcage coil. The third loop conductor 583 substantially reduces next-nearest neighbor radio frequency coupling. The improved isolation provides better efficiency and improved control over current in the individual meshes versus a degenerate two-ring birdcage coil.

In reference to FIG. 12, the notation "to R[ ]" where [ ] ranges from 1–8 indicates connection to radio frequency signal receivers R1–R8 used for receiving magnetic resonance signals. Similarly, the notation "to T[ ]" where [ ] ranges from 1–8 indicates connection to radio frequency signal transmitters T1–T8 used for selectively energizing selected meshes of the radio frequency coil 516.

FIG. 13 diagrammatically illustrates details of one of the T/R switches 590. During the transmit cycle, a switching bias 600 is applied to one end of inductor 601 to operatively connect a transmitter input 602 with the radio frequency shield trap 604 and thence to the matching capacitor C-Match of the coupled coil mesh of the birdcage coil 516. During the receive cycle, the switching bias 600 is switched so that PIN diode 606 isolates the transmitter input 602 from the trap 604, and magnetic resonance signals picked up by the coupled coil mesh of the birdcage coil 516 are transmitted via quarter wavelength transmission lines 610, 612 to a preamplifier 614 that produces a conditioned signal which is fed to a receiver coupling 616.

Using the degenerate birdcage coil 516 with high isolation of individual meshes provided by the first, second, and third conductor loops 581, 582 and 583, along with the T/R switches 590 that individually operate each isolated mesh, the coil 516 can be operated in various modes. For example, the coil 516 can be operated as a volume resonator by employing appropriate relative phasing of the transmitter signals. At high magnetic fields (for example at $B_0$=3.0 Tesla or higher), radiation losses can be reduced through individual control of the coil mesh segments. The degenerate coil 516 can also be operated as a coils array for either transmitting radio frequency pulses or for detecting magnetic resonance. For example, the coil meshes can be used as a transmit or receive sensitivity encoding (SENSE) coil array, as a coil array for parallel imaging, or the like.

While circular conductor loops have been described, other shapes are also contemplated, for example, polygons (having as many angles as there are conductors) or elliptical shapes. The conductor loops are also optionally not closed and one of the meshes may possibly be omitted. Additionally, while specific references have been made to capacitors and/or capacitances and inductors and/or inductances, it is to be appreciated that similarly reactive elements, distributed reactive elements, or equivalent circuits with like reactances may be substituted where appropriate. Moreover, it is contemplated to have the third conductor loop have a different diameter or other cross-sectional dimension versus the second conductor loop, so that one can be arranged inside of the other. In such an arrangement, the second and third conductor loops can be coplanar or can be axially spaced apart along the axis of the coil. It is further contemplated that the third conductor can be an end cap or plate.

The invention has been described with reference to the preferred embodiment. Obviously, modifications and alterations will occur to others upon reading and understanding the preceding description. It is intended that the invention be construed as including all such modifications and alterations insofar as they come within the scope of the appended claims or the equivalents thereof.

Having described the preferred embodiments, the invention is now claimed to be:

1. A birdcage coil system for use in conjunction with a magnetic resonance apparatus, the birdcage coil system comprising:
    a birdcage coil tuned to degeneracy the coil including:
        a first conductive loop,
        a second conductive loop, and
        a plurality of first conductor rungs disposed between the first and second conductive loops and in electrical connection therewith; and
    a switching system which switches the birdcage coil at least between:
        an RF transmit mode, and
        an RF receive mode,
    the switching system including:
        a plurality of RF transmit feed points in electrical connection with the first conductive loop for feeding RF transmit signals to the coil;
        a plurality of transmit PIN diodes for coupling RF transmit feeds to the feed points;
        a plurality of RF receive take-off points disposed across matching capacitors;
        a plurality of matching PIN diodes arranged in parallel with the matching capacitors; and
        a plurality of cage DC bias inputs in electrical connection with the transmit and matching diodes for biasing the transmit and matching PIN diodes.

2. A birdcage coil system as set forth in claim 1 wherein: in the transmit mode the birdcage coil is adapted to operate as a quadrature RF transmit coil.

3. A birdcage coil system as set forth in claim 1 wherein: the birdcage coil is adapted to operate as a parallel imaging RF coil.

4. A birdcage coil system as set forth in claim 1 wherein: in transmit mode, said transmit and matching PIN diodes arc forward biased by cage DC bias whereby the transmit PIN diodes provide connections for the transmit signals from an RF transmitter to pass to the birdcage coil and the matching PIN diodes short-out the matching capacitor and prevent RF signal take-off.

5. A birdcage coil system as set forth in claim 4 wherein: in the receive mode, said transmit and matching PIN diodes are reverse biased by cage DC bias whereby the transmit PIN diodes disconnect the birdcage coil from the RF transmitter and the matching PIN diodes allow RF signal take-off.

6. A magnetic resonance imaging system comprising: a main magnet generating a temporally constant magnetic field;
    magnetic field gradient coils selectively imposing selected magnetic field gradients on the temporally constant magnetic field; and
    the birdcage coil of claim 1.

7. A birdcage coil system for use in conjunction with a magnetic resonance apparatus, the birdcage coil system comprising:
    a birdcage coil tuned to degeneracy, the coil including:
        first conductive loop,
        a second conductive loop, and
        a plurality of first conductor rungs disposed between the first and second conductive loops and in electrical connection therewith; and
    switching elements switch the birdcage coil at least between:
        an RF transmit mode, and
        an RF receive mode,
        a plurality of feed points on the first conductive loop, for feeding RF transmit signals to the coil,
    the switching means elements further including:
        a plurality of preamp PIN diodes in electrical connection with corresponding RF receive pre-amplifiers, the receive pre-amplifiers being connected with take-off points on one of the conductive loops;
a plurality of preamp DC bias inputs in electrical connection with the preamp PIN diodes for biasing the preamp diodes and shorting-out the RF receive pre-amplifiers.

8. A birdcage coil system as set forth in, claim 7 wherein:
the switching elements are further adapted to switch the birdcage coil to a decoupled mode in which the cage DC bias reverse biases the transmit and matching PIN diodes and the preamp DC bias forward biases the preamp PIN diode whereby the RF coil is decoupled from the magnetic resonance apparatus.

9. A birdcage coil system for use in conjunction with a magnetic resonance imaging apparatus, the birdcage coil system comprising:
a birdcage coil tuned to degeneracy, the coil including:
a first conductive loop,
a second conductive loop,
a plurality of first conductor rungs disposed between the first and second conductive loops and in electrical connection therewith,
a third conductor coupled at radio frequencies with the second conductive loop;
a plurality of second conductor rungs disposed between the second conductive loop and third conductor and in electrical connection therewith,
wherein reactances of at least one of the third conductor and the plurality of second conductor rungs are selected to decouple next-neighbor meshes of the birdcage coil; and
a switching means for switching the birdcage coil at least between:
an RF transmit mode, and
an RF receive mode in which in the birdcage coil is adapted to operate as a phased array RF receive coil.

10. A birdcage coil system as set forth in claim 9, wherein the birdcage coil is a degenerate birdcage coil defining a plurality of meshes that are decoupled at least from nearest neighbor and next-nearest neighbor meshes, and the switching means comprises:
a plurality of transmit/receive switches connected with the meshes to independently operate the plurality of decoupled meshes.

11. A birdcage coil system as set forth in claim 10, wherein each of the transmit/receive switches comprises:
a mesh coupling connecting the transmit/receive switch with the corresponding decoupled mesh;
a receive circuit communicating with the mesh coupling; and
a transmitter input; and
a means for selectively connecting the transmitter input with the mesh coupling.

12. A birdcage coil as set forth in claim 9 wherein:
the first and second loops are arranged on opposite ends of the first conductor rungs, said plurality of first conductive rungs making electrical connections with the first and second conductive loops such that said first and second conductive loops have first and second segments thereof situated between the electrical connections of neighboring first conductive rungs and a pair of neighboring first conductive rungs and the first and second loop segments situated between the electrical connections with the pair define a mesh; and
the birdcage further comprising:
first rung reactances are disposed within the first conductive rungs;
first loop reactances are disposed within the first loop segments; and
second loop reactances are disposed within the second loop segments.

13. A birdcage coil as set forth in claim 12 further comprising:
a plurality of second conductor rungs extending between the second conductor loop and the third conductor such that the third conductor is arranged on a side of the second loop opposite the first loop, said plurality of second rungs making electrical connections with the second conductive loop and the third conductor such that said third conductor has segments thereof situated between the electrical connections of neighboring second members.

14. A birdcage coil as set forth in claim 13 wherein:
the second rungs are equal in number to the first rungs, and the first same locations.

15. A birdcage coil as set forth in claim 14 wherein the first and second rungs are formed to be single conductive rungs that have an electrical intersection with the second loop and ends which make electrical connections with the first loop and the third conductor, respectively.

16. A birdcage coil as set forth in claim 15 further comprising:
second rung reactances disposed within the second rungs.

17. A birdcage coil as set forth in claim 16 wherein:
the first rung, second rung, first loop, and second loop reactances comprise first rung capacitors, second rung capacitors, first loop capacitors, and second loop capacitors, respectively.

18. A birdcage coil as set forth in claim 9, wherein one of the second conductive loop and the third conductor lies inside of the other.

19. A birdcage coil as set forth in claim 18, wherein the second conductor loop and the third conductor are coplanar.

20. A birdcage coil as set forth in claim 9, wherein the third conductive loop is inductively coupled with the second conductive loop.

21. A birdcage coil as set forth in claim 20, wherein the third conductor includes inductances selected to decouple next-nearest neighbor meshes of the birdcage coil.

22. A birdcage coil as set forth in claim 9, wherein reactances of the conductor rungs, conductive loops, and conductors are selected such that the birdcage coil is a degenerate birdcage coil having nearest neighbor and next-nearest neighbor meshes substantially decoupled.

23. A birdcage coil as set forth in claim 9, wherein the birdcage coil is a degenerate birdcage coil defining a plurality of meshes that are decoupled at least from nearest neighbor and next-nearest neighbor meshes, the birdcage coil further comprising:
a plurality of transmit/receive switches connected with the meshes to independently operate the plurality of decoupled meshes as at least one of radio frequency transmitters and radio frequency receivers.

24. A birdcage coil as set forth in claim 23, wherein the transmit/receive switches are adapted to operate the birdcage coil as at least one of:
a volume resonator,
a transmit SENSE coil array,
a receive SENSE coil array, and
a parallel imaging coil array.

25. A birdcage coil system for use in conjunction with a magnetic resonance imaging apparatus, the birdcage coil system comprising:

a birdcage coil tuned to degeneracy, the coil including:
  a first conductive loop, the first conductive loop being interrupted by a plurality of matching capacitors,
  a second conductor loop,
  a plurality of first conductor rungs disposed between the first and second conductive loops and in electrical connection therewith,
  a third conductive loop capacitively coupled to the second conductive loop,
  a plurality of second conductor rungs disposed between the second and third conductive loops and in electrical connection therewith,
  a plurality of feed points for feeding RF transmit signals to the coil from an RF transmitter in a transmit mode,
  a plurality of take-off points defined across the matching capacitors from which received signals are conveyed to a plurality of preamplifiers in a receive mode, and
  wherein reactances of at least one of third conductive loop and the plurality of second conductor rungs are selected to decouple next-neighbor meshes of the birdcage coil.

26. A birdcage coil system as set forth in claim 25, further including:

a switching system which switches the coil between a transmit mode and a receive mode, the switching system including:
  a plurality of transmit PIN diodes which couple the RF transmit signals to the feed points;
  a plurality of matching PIN diodes arranged in parallel with the matching capacitors;
  a plurality of preamp PIN diodes in electrical connection with the plurality of preamp PIN diodes;
a DC bias source which:
  in a transmit mode, biases the transmit PIN diodes to pass the RF transmit signals to the feed points from the RF transmitter, biases the matching PIN diodes to short the matching capacitors, and biases the preamp PIN diodes to prevent RF signals from being taken off and conveyed to the preamplifiers, and
  in a receive mode, biases the transmit PIN diodes to disconnect the feed points from the RF transmitter and biases the matching and preamp PIN diodes to allow RF signals to be taken off and supplied to the preamplifiers.

* * * * *